(12) United States Patent
Beaver et al.

(10) Patent No.: US 10,355,515 B2
(45) Date of Patent: Jul. 16, 2019

(54) MULTI-SUPPLY SYNCHRONIZATION FOR WIRELESS CHARGING

(71) Applicant: WiTricity Corporation, Watertown, MA (US)

(72) Inventors: Jonathan Beaver, Auckland (NZ); Chang-Yu Huang, Auckland (NZ); Michael Le Gallais Kissin, Auckland (NZ); Hao Hao, Auckland (NZ)

(73) Assignee: WiTricity Corporation, Watertown, MA (US)

( * ) Notice: Subject to any disclaimer, the term of this patent is extended or adjusted under 35 U.S.C. 154(b) by 6 days.

(21) Appl. No.: 15/601,837

(22) Filed: May 22, 2017

(65) Prior Publication Data

US 2018/0337548 A1 Nov. 22, 2018

(51) Int. Cl.

| | |
|---|---|
| *H02J 7/00* | (2006.01) |
| *H02J 7/02* | (2016.01) |
| *H02J 50/12* | (2016.01) |
| *H02J 50/60* | (2016.01) |
| *H02J 50/90* | (2016.01) |
| *G01R 25/00* | (2006.01) |
| *H02J 50/10* | (2016.01) |
| *H02J 50/40* | (2016.01) |
| *B60L 53/12* | (2019.01) |

(52) U.S. Cl.
CPC .............. *H02J 7/025* (2013.01); *B60L 53/12* (2019.02); *G01R 25/005* (2013.01); *H02J 50/10* (2016.02); *H02J 50/12* (2016.02); *H02J 50/40* (2016.02); *H02J 50/60* (2016.02); *H02J 50/90* (2016.02)

(58) Field of Classification Search
USPC .................................. 320/107, 108, 109, 110
See application file for complete search history.

(56) References Cited

U.S. PATENT DOCUMENTS

| | | | |
|---|---|---|---|
| 2009/0003022 A1 | 1/2009 | Nunoya et al. | |
| 2010/0315045 A1 | 12/2010 | Zeine | |
| 2012/0098485 A1* | 4/2012 | Kang ...................... | H02J 50/40 320/108 |

(Continued)

FOREIGN PATENT DOCUMENTS

JP 2016001692 A 1/2016

OTHER PUBLICATIONS

International Search Report and Written Opinion—PCT/US2018/033010—ISA/EPO—dated Jul. 18, 2018.

*Primary Examiner* — Brian Ngo
(74) *Attorney, Agent, or Firm* — Colby Nipper PLLC

(57) ABSTRACT

Certain aspects of the present disclosure are generally directed to apparatus and techniques for wirelessly charging a device. An exemplary method generally includes receiving, at a first wireless power transfer device, a synchronization signal indicative of a phase for generating a wireless charging field, determining an adjusted phase for generating the wireless charging field based, at least in part, on the received synchronization signal and one or more measurements taken at least one of the first wireless power transfer device or a second wireless power transfer device, wherein the one or more measurements are indicative of a phase difference between the first wireless power transfer device and the second wireless power transfer device, and generating, at the first wireless power transfer device, the wireless charging field with the adjusted phase.

27 Claims, 6 Drawing Sheets

(56) References Cited

U.S. PATENT DOCUMENTS

| | | |
|---|---|---|
| 2012/0214536 A1 | 8/2012 | Kim et al. |
| 2015/0298561 A1 | 10/2015 | Keeling et al. |
| 2015/0333537 A1* | 11/2015 | Uchida .................. H01F 38/14 307/104 |
| 2016/0064943 A1 | 3/2016 | Ku et al. |
| 2016/0064994 A1* | 3/2016 | Ku ......................... H02J 7/025 307/104 |
| 2017/0149294 A1* | 5/2017 | Wight ..................... H02J 50/90 |

* cited by examiner

MULTI-SUPPLY SYNCHRONIZATION FOR WIRELESS CHARGING

TECHNICAL FIELD

The present disclosure relates generally to wireless charging power transfer applications, and in particular, to synchronizing the phases of multiple wireless power transfer elements.

BACKGROUND

Remote systems, such as vehicles, have been introduced that include locomotion power derived from electricity received from an energy storage device, such as a battery. For example, hybrid electric vehicles include on-board chargers that use power from vehicle braking and traditional motors to charge the vehicles. Vehicles that are solely electric generally receive the electricity for charging the batteries from other sources. Battery electric vehicles (electric vehicles) are often proposed to be charged through some type of wired alternating current (AC) such as household or commercial AC supply sources. The wired charging connections require cables or other similar connectors that are physically connected to a power supply. Cables and similar connectors may sometimes be inconvenient or cumbersome and have other drawbacks. Wireless power charging systems that are capable of transferring power in free space (e.g., via a wireless field) to be used to charge electric vehicles may overcome some of the deficiencies of wired charging solutions. As such, wireless power charging systems and methods that efficiently and safely transfer power for charging electric vehicles are desirable.

Inductive power transfer (IPT) systems are one means for the wireless transfer of energy. In IPT, a primary (or "base") power device (e.g., a base pad, wireless power transfer pad, base wireless charging system, or some other wireless power transfer device including a power transfer element (e.g., base power transfer element)) transmits power to a secondary (or "pick-up") power receiver device (e.g., a vehicle pad, an electric vehicle wireless charging unit, or some other wireless power receiving device including a power transfer element (e.g., vehicle power transfer element)). Each of the transmitter and receiver power devices includes inductors, typically coils or windings of electric current conveying media. An alternating current in the primary inductor produces a fluctuating magnetic field. When the secondary inductor is placed in proximity to the primary inductor, the fluctuating magnetic field induces an electromotive force (EMF) in the secondary inductor, thereby transferring power to the secondary power receiver device. In certain systems, such as large scale car-park deployments, semi-dynamic or dynamic systems, it is possible that individual wireless power transfer pads may be driven separately yet capable of interacting magnetically. This magnetic coupling can cause issues with regulations, operation of primary/ancillary systems, or even cause unnecessary power transfer.

SUMMARY

Certain aspects of the present disclosure are directed to a method for wireless charging. The method generally includes receiving, at a first wireless power transfer device, a synchronization signal indicative of a phase for generating a wireless charging field, determining an adjusted phase for generating the wireless charging field based, at least in part, on the received synchronization signal and one or more measurements taken at at least one of the first wireless power transfer device or a second wireless power transfer device, wherein the one or more measurements are indicative of a phase difference between the first wireless power transfer device and the second wireless power transfer device, and generating, at the first wireless power transfer device, the wireless charging field with the adjusted phase.

Certain aspects of the present disclosure are directed to an apparatus for wireless charging. The apparatus generally includes at least one processor configured to receive, at a first wireless power transfer device, a synchronization signal indicative of a phase for generating a wireless charging field and determine an adjusted phase for generating the wireless charging field based, at least in part, on the received synchronization signal and one or more measurements taken at at least one of the first wireless power transfer device or a second wireless power transfer device, wherein the one or more measurements are indicative of a phase difference between the first wireless power transfer device and the second wireless power transfer device. The apparatus also generally includes a wireless power transfer element configured to generate, at the first wireless power transfer device, the wireless charging field with the adjusted phase.

Certain aspects of the present disclosure are directed to an apparatus for wireless charging. The apparatus generally includes means for receiving configured to receive, at a first wireless power transfer device, a synchronization signal indicative of a phase for generating a wireless charging field, means for determining configured to determine an adjusted phase for generating the wireless charging field based, at least in part, on the received synchronization signal and one or more measurements taken at at least one of the first wireless power transfer device or a second wireless power transfer device, wherein the one or more measurements are indicative of a phase difference between the first wireless power transfer device and the second wireless power transfer device, and means for generating configured to generate, at the first wireless power transfer device, the wireless charging field with the adjusted phase.

Certain aspects of the present disclosure are directed to a non-transitory computer-readable medium for wireless charging. The non-transitory computer-readable medium generally includes instructions, that when executed by at least one processor, cause the at least one processor to receive, at a first wireless power transfer device, a synchronization signal indicative of a phase for generating a wireless charging field, determine an adjusted phase for generating the wireless charging field based, at least in part, on the received synchronization signal and one or more measurements taken at at least one of the first wireless power transfer device or a second wireless power transfer device, wherein the one or more measurements are indicative of a phase difference between the first wireless power transfer device and the second wireless power transfer device, and generate, at the first wireless power transfer device, the wireless charging field with the adjusted phase.

Other aspects, features, and embodiments of the present disclosure will become apparent to those of ordinary skill in the art, upon reviewing the following description of specific, exemplary aspects of the present disclosure in conjunction with the accompanying figures. While features of the present disclosure may be discussed relative to certain aspects and figures below, all aspects of the present disclosure can include one or more of the advantageous features discussed herein. In other words, while one or more aspects may be discussed as having certain advantageous features, one or more of such features may also be used in accordance with the various aspects of the present disclosure. In similar fashion, while exemplary aspects may be discussed below as device, system, or method aspects it should be understood that such exemplary aspects can be implemented in various devices, systems, and methods.

The following detailed description and accompanying drawings provide a better understanding of the nature and advantages of the present disclosure.

BRIEF DESCRIPTION OF THE DRAWINGS

With respect to the discussion to follow and in particular to the drawings, it is stressed that the particulars shown represent examples for purposes of illustrative discussion, and are presented in the cause of providing a description of principles and conceptual aspects of the present disclosure. In this regard, no attempt is made to show implementation details beyond what is needed for a fundamental understanding of the present disclosure. The discussion to follow, in conjunction with the drawings, makes apparent to those of skill in the art how embodiments in accordance with the present disclosure may be practiced. In the accompanying drawings.

DETAILED DESCRIPTION

The detailed description set forth below in connection with the appended drawings is intended as a description of exemplary implementations and is not intended to represent the only implementations in which the invention may be practiced. The term "exemplary" used throughout this description means "serving as an example, instance, or illustration," and should not necessarily be construed as preferred or advantageous over other exemplary implementations. The detailed description includes specific details for the purpose of providing a thorough understanding of the exemplary implementations. In some instances, some devices are shown in block diagram form.

Wirelessly transferring power may refer to transferring any form of energy associated with electric fields, magnetic fields, electromagnetic fields, or otherwise from a transmitter to a receiver without the use of physical electrical conductors (e.g., power may be transferred through free space). The power output into a wireless field (e.g., a magnetic field) may be received, captured by, or coupled by a "receiving coil" to achieve power transfer.

An electric vehicle is used herein to describe a remote system, an example of which is a vehicle that includes, as part of its locomotion capabilities, electrical power derived from a chargeable energy storage device (e.g., one or more rechargeable electrochemical cells or other type of battery). As non-limiting examples, some electric vehicles may be hybrid electric vehicles that include, besides electric motors, a traditional combustion engine for direct locomotion or to charge the vehicle's battery. Other electric vehicles may draw all locomotion ability from electrical power. An electric vehicle is not limited to an automobile and may include motorcycles, carts, scooters, and the like. By way of example and not limitation, a remote system is described herein in the form of an electric vehicle (EV). Furthermore, other remote systems that may be at least partially powered using a chargeable energy storage device are also contemplated (e.g., electronic devices such as personal computing devices and the like).

Figure 1:
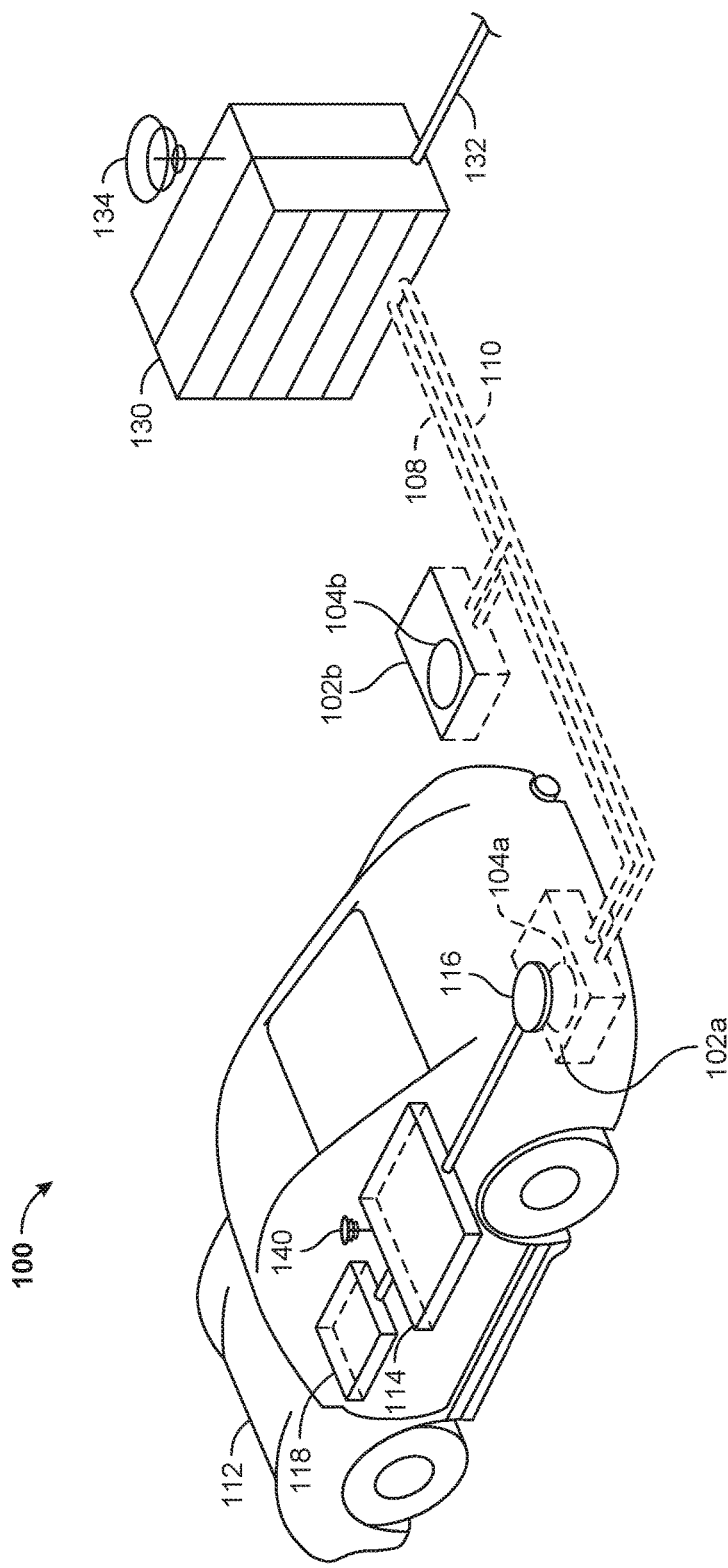
FIG. 1 illustrates a wireless power transfer system for charging an electric vehicle, in accordance with certain aspects of the present disclosure.

FIG. 1 is a diagram of an exemplary wireless power transfer system 100 for charging an electric vehicle, in accordance with some exemplary implementations. The wireless power transfer system 100 enables charging of an electric vehicle 112 while the electric vehicle 112 is parked so as to efficiently couple with a base wireless charging system 102a. Spaces for two electric vehicles are illustrated in a parking area to be parked over corresponding base wireless charging systems 102a and 102b. In some implementations, a local power source 130 (e.g., local distribution center) may be connected to a power backbone 132 and configured to provide an alternating current (AC) or a direct current (DC) supply through a power link 110 to the base wireless charging systems 102a and 102b. Each of the base wireless charging systems 102a and 102b also includes a base power transfer element 104a and 104b, respectively, for wirelessly transferring power. In some other implementations (not shown in FIG. 1), base power transfer elements 104a or 104b may be stand-alone physical units and are not part of the base wireless charging system 102a or 102b.

The electric vehicle 112 may include a battery unit 118, an electric vehicle power transfer element 116, and an electric vehicle wireless charging unit 114. The electric vehicle wireless charging unit 114 and the electric vehicle power transfer element 116 constitute the electric vehicle wireless charging system. In some diagrams shown herein, the electric vehicle wireless charging unit 114 is also referred to as the vehicle charging unit (VCU). The electric vehicle power transfer element 116 may interact with the base power transfer element 104a for example, via a region of the electromagnetic field generated by the base power transfer element 104a.

In some exemplary implementations, the electric vehicle power transfer element 116 may receive power when the electric vehicle power transfer element 116 is located in an electromagnetic field produced by the base power transfer element 104a. The field may correspond to a region where energy output by the base power transfer element 104a may be captured by the electric vehicle power transfer element 116. For example, the energy output by the base power transfer element 104a may be at a level sufficient to charge or power the electric vehicle 112. In some cases, the field may correspond to a "near-field" of the base power transfer element 104a. The near-field may correspond to a region in which there are strong reactive fields resulting from the currents and charges in the base power transfer element 104a that do not radiate power away from the base power transfer element 104a. In some cases the near-field may correspond to a region that is within about ½π (of a wavelength of the a frequency of the electromagnetic field produced by the base power transfer element 104a distant from the base power transfer element 104a, as will be further described below.

The electric vehicle power transfer element 116 and base power transfer element 104 as described throughout the disclosed implementations may be referred to or configured as "loop" antennas, and more specifically, multi-turn loop antennas. The elements 104 and 116 may also be referred to herein or be configured as "magnetic" antennas. The term "power transfer element" is intended to refer to a component that may wirelessly output or receive energy for coupling to another "power transfer element." The power transfer element may also be referred to as an "antenna" or a "coupler" of a type that is configured to wirelessly output or receive power. As used herein, power transfer elements 104 and 116 are examples of "power transfer components" of a type that are configured to wirelessly output, wirelessly receive, and/ or wirelessly relay power. Loop (e.g., multi-turn loop) antennas may be configured to include an air core or a physical core such as a ferrite core. An air core loop antenna may allow the placement of other components within the core area. Physical core antennas including ferromagnetic or ferromagnetic materials may allow development of a stronger electromagnetic field and improved coupling.

Local distribution center 130 may be configured to communicate with external sources (e.g., a power grid) via a communication backhaul 134, and with the base wireless charging system 102a via a communication link 108.

In some implementations, the electric vehicle power transfer element 116 may be aligned with the base power transfer element 104a and, therefore, disposed within a near-field region simply by the electric vehicle operator positioning the electric vehicle 112 such that the electric vehicle power transfer element 116 is sufficiently aligned relative to the base power transfer element 104a. Alignment may be considered sufficient when an alignment error has fallen below a tolerable value. In other implementations, the operator may be given visual and/or auditory feedback to determine when the electric vehicle 112 is properly placed within a tolerance area for wireless power transfer. In yet other implementations, the electric vehicle 112 may be positioned by an autopilot system, which may move the electric vehicle 112 until the sufficient alignment is achieved. This may be performed automatically and autonomously by the electric vehicle 112 with or without driver intervention. This may be possible for an electric vehicle 112 that is equipped with a servo steering, radar sensors (e.g., ultrasonic sensors), and intelligence for safely maneuvering and adjusting the electric vehicle. In still other implementations, the electric vehicle 112 and/or the base wireless charging system 102a may have functionality for mechanically displacing and moving the power transfer elements 116 and 104a, respectively, relative to each other to more accurately orient or align them and develop sufficient and/or otherwise more efficient coupling there between.

The base wireless charging system 102a may be located in a variety of locations. As non-limiting examples, some suitable locations include a parking area at a home of the electric vehicle 112 owner, parking areas reserved for electric vehicle wireless charging modeled after conventional petroleum-based filling stations, and parking lots at other locations such as shopping centers and places of employment.

Charging electric vehicles wirelessly may provide numerous benefits. For example, charging may be performed automatically, virtually without driver intervention or manipulation thereby improving convenience to a user. There may also be no exposed electrical contacts and no mechanical wear out, thereby improving reliability of the wireless power transfer system 100. Safety may be improved since manipulations with cables and connectors may not be needed and there may be no cables, plugs, or sockets to be exposed to moisture in an outdoor environment. In addition, there may also be no visible or accessible sockets, cables, or plugs, thereby reducing potential vandalism of power charging devices. Further, since the electric vehicle 112 may be used as distributed storage devices to stabilize a power grid, a convenient docking-to-grid solution may help to increase availability of vehicles for vehicle-to-grid (V2G) operation.

The wireless power transfer system 100 as described with reference to FIG. 1 may also provide aesthetical and non-impedimental advantages. For example, there may be no charge columns and cables that may be impedimental for vehicles and/or pedestrians.

As a further explanation of the vehicle-to-grid capability, the wireless power transmit and receive capabilities may be configured to be reciprocal such that either the base wireless charging system 102a can transmit power to the electric vehicle 112 or the electric vehicle 112 can transmit power to the base wireless charging system 102a. This capability may be useful to stabilize the power distribution grid by allowing electric vehicles 112 to contribute power to the overall distribution system in times of energy shortfall caused by over demand or shortfall in renewable energy production (e.g., wind or solar).

Figure 2:
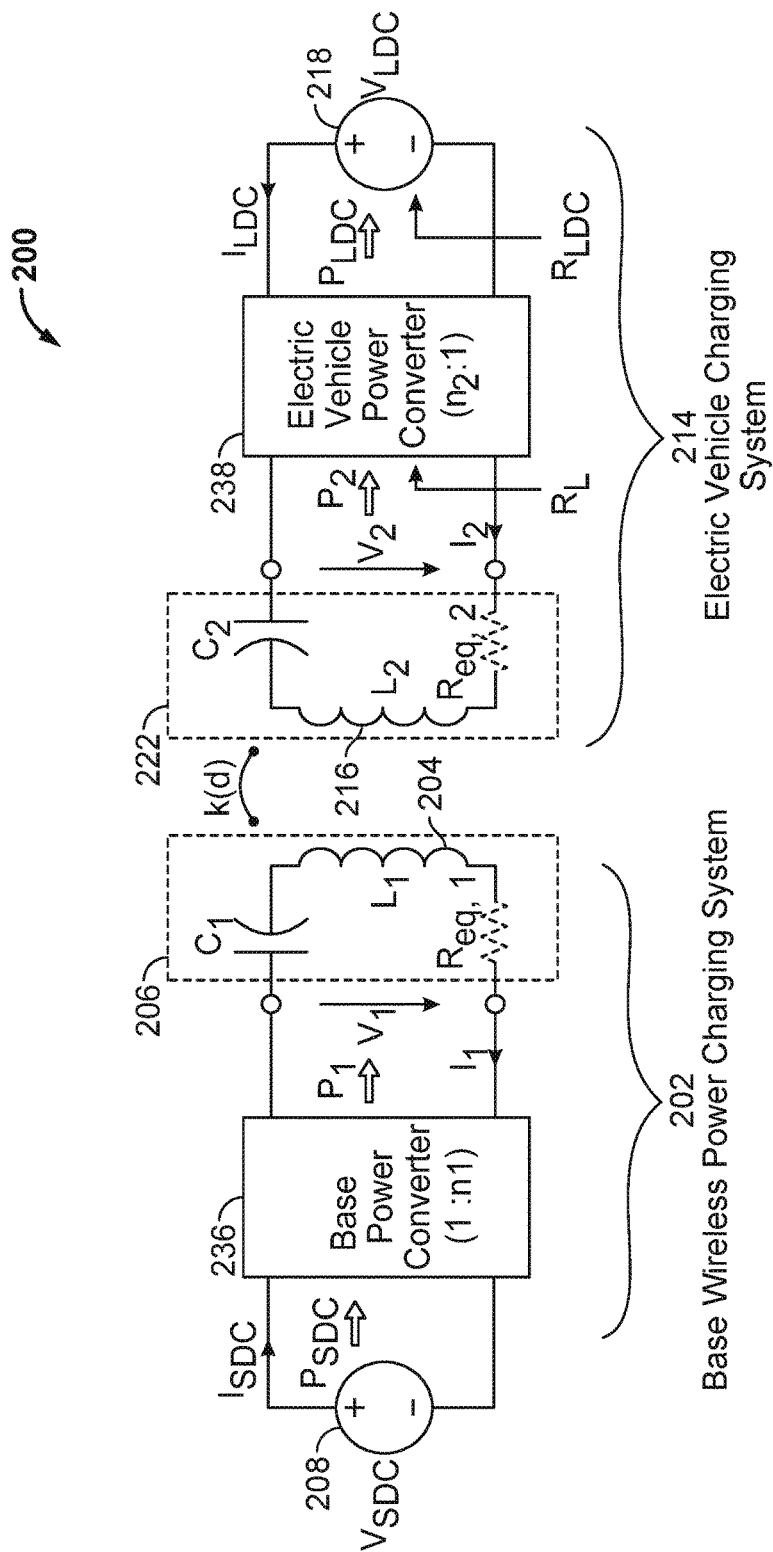
FIG. 2 is a schematic diagram of exemplary components of the wireless power transfer system, in accordance with certain aspects of the present disclosure.

FIG. 2 is a schematic diagram of exemplary components of a wireless power transfer system 200 similar to that previously discussed in connection with FIG. 1, in accordance with some exemplary implementations. The wireless power transfer system 200 may include a base resonant circuit 206 including a base power transfer element 204 having an inductance L1. The wireless power transfer system 200 further includes an electric vehicle resonant circuit 222 including an electric vehicle power transfer element 216 having an inductance L2. Implementations described herein may use capacitively loaded conductor loops (i.e., multi-turn coils) forming a resonant structure that is capable of efficiently coupling energy from a primary structure (transmitter) to a secondary structure (receiver) via a magnetic or electromagnetic near-field if both the transmitter and the receiver are tuned to a common resonant frequency. The coils may be used for the electric vehicle power transfer element 216 and the base power transfer element 204. Using resonant structures for coupling energy may be referred to as "magnetically coupled resonance," "electromagnetically coupled resonance," and/or "resonant induction." The operation of the wireless power transfer system 200 will be described based on power transfer from a base power transfer element 204 to an electric vehicle 112 (not shown), but is not limited thereto. For example, as discussed above, energy may be also transferred in the reverse direction.

With reference to FIG. 2, a power supply 208 (e.g., AC or DC) supplies power PSDC to the base power converter 236 as part of the base wireless power charging system 202 to transfer energy to an electric vehicle (e.g., electric vehicle 112 of FIG. 1). The base power converter 236 may include circuitry such as an AC-to-DC converter configured to convert power from standard mains AC to DC power at a suitable voltage level, and a DC-to-low frequency (LF)

converter configured to convert DC power to power at an operating frequency suitable for wireless high power transfer. The base power converter 236 supplies power P1 to the base resonant circuit 206 including tuning capacitor C1 in series with base power transfer element 204 to emit an electromagnetic field at the operating frequency. The series-tuned resonant circuit 206 should be construed as exemplary. In another implementation, the capacitor C1 may be coupled with the base power transfer element 204 in parallel. In yet other implementations, tuning may be formed of several reactive elements in any combination of parallel or series topology. The capacitor C1 may be provided to form a resonant circuit with the base power transfer element 204 that resonates substantially at the operating frequency. The base power transfer element 204 receives the power P1 and wirelessly transmits power at a level sufficient to charge or power the electric vehicle. For example, the level of power provided wirelessly by the base power transfer element 204 may be on the order of kilowatts (kW) (e.g., anywhere from 1 kW to 110 kW, although actual levels may be or higher or lower).

The base resonant circuit 206 (including the base power transfer element 204 and tuning capacitor C1) and the electric vehicle resonant circuit 222 (including the electric vehicle power transfer element 216 and tuning capacitor C2) may be tuned to substantially the same frequency. The electric vehicle power transfer element 216 may be positioned within the near-field of the base power transfer element and vice versa, as further explained below. In this case, the base power transfer element 204 and the electric vehicle power transfer element 216 may become coupled to one another such that power may be transferred wirelessly from the base power transfer element 204 to the electric vehicle power transfer element 216. The series capacitor C2 may be provided to form a resonant circuit with the electric vehicle power transfer element 216 that resonates substantially at the operating frequency. The series-tuned resonant circuit 222 should be construed as being exemplary. In another implementation, the capacitor C2 may be coupled with the electric vehicle power transfer element 216 in parallel. In yet other implementations, the electric vehicle resonant circuit 222 may be formed of several reactive elements in any combination of parallel or series topology. Element k(d) represents the mutual coupling coefficient resulting at coil separation d. Equivalent resistances Req,1 and Req,2 represent the losses that may be inherent to the base and electric vehicle power transfer elements 204 and 216 and the tuning (anti-reactance) capacitors C1 and C2, respectively. The electric vehicle resonant circuit 222, including the electric vehicle power transfer element 216 and capacitor C2, receives and provides the power P2 to an electric vehicle power converter 238 of an electric vehicle charging system 214.

The electric vehicle power converter 238 may include, among other things, a LF-to-DC converter configured to convert power at an operating frequency back to DC power at a voltage level of the load 218 that may represent the electric vehicle battery unit. The electric vehicle power converter 238 may provide the converted power PLDC to the load 218. The power supply 208, base power converter 236, and base power transfer element 204 may be stationary and located at a variety of locations as discussed above. The electric vehicle load 218 (e.g., the electric vehicle battery unit), electric vehicle power converter 238, and electric vehicle power transfer element 216 may be included in the electric vehicle charging system 214 that is part of the electric vehicle (e.g., electric vehicle 112) or part of its battery pack (not shown). The electric vehicle charging system 214 may also be configured to provide power wirelessly through the electric vehicle power transfer element 216 to the base wireless power charging system 202 to feed power back to the grid. Each of the electric vehicle power transfer element 216 and the base power transfer element 204 may act as transmit or receive power transfer elements based on the mode of operation.

While not shown, the wireless power transfer system 200 may include a load disconnect unit (LDU) (not known) to safely disconnect the electric vehicle load 218 or the power supply 208 from the wireless power transfer system 200. For example, in case of an emergency or system failure, the LDU may be triggered to disconnect the load from the wireless power transfer system 200. The LDU may be provided in addition to a battery management system for managing charging to a battery, or it may be part of the battery management system.

Further, the electric vehicle charging system 214 may include switching circuitry (not shown) for selectively connecting and disconnecting the electric vehicle power transfer element 216 to the electric vehicle power converter 238. Disconnecting the electric vehicle power transfer element 216 may suspend charging and also may change the "load" as "seen" by the base wireless power charging system 202 (acting as a transmitter), which may be used to "cloak" the electric vehicle charging system 214 (acting as the receiver) from the base wireless power charging system 202. The load changes may be detected if the transmitter includes a load sensing circuit. Accordingly, the transmitter, such as the base wireless power charging system 202, may have a mechanism for determining when receivers, such as the electric vehicle charging system 214, are present in the near-field coupling mode region of the base power transfer element 204 as further explained below.

As described above, in operation, during energy transfer towards an electric vehicle (e.g., electric vehicle 112 of FIG. 1), input power is provided from the power supply 208 such that the base power transfer element 204 generates an electromagnetic field for providing the energy transfer. The electric vehicle power transfer element 216 couples to the electromagnetic field and generates output power for storage or consumption by the electric vehicle 112. As described above, in some implementations, the base resonant circuit 206 and electric vehicle resonant circuit 222 are configured and tuned according to a mutual resonant relationship such that they are resonating nearly or substantially at the operating frequency. Transmission losses between the base wireless power charging system 202 and electric vehicle charging system 214 are minimal when the electric vehicle power transfer element 216 is located in the near-field coupling mode region of the base power transfer element 204 as further explained below.

As stated, an efficient energy transfer occurs by transferring energy via a magnetic near-field rather than via electromagnetic waves in the far field, which may involve substantial losses due to radiation into the space. When in the near-field, a coupling mode may be established between the transmit power transfer element and the receive power transfer element. The space around the power transfer elements where this near-field coupling may occur is referred to herein as a near-field coupling mode region.

While not shown, the base power converter 236 and the electric vehicle power converter 238 if bidirectional may both include, for the transmit mode, an oscillator, a driver circuit such as a power amplifier, a filter and matching circuit, and for the receive mode a rectifier circuit. The oscillator may be configured to generate a desired operating frequency, which may be adjusted in response to an adjustment signal. The oscillator signal may be amplified by a power amplifier with an amplification amount responsive to control signals. The filter and matching circuit may be included to filter out harmonics or other unwanted frequencies and match the impedance as presented by the resonant circuits 206 and 222 to the base power converter 236 and the electric vehicle power converter 238. For the receive mode, the base power converter 236 and the electric vehicle power converter 238 may also include a rectifier and switching circuitry.

As discussed above, efficient transfer of energy between a transmitter and receiver occurs during matched or nearly matched resonance between a transmitter and a receiver. However, even when resonance between a transmitter and receiver are not matched, energy may be transferred at a lower efficiency.

A resonant frequency may be based on the inductance and capacitance of a resonant circuit (e.g. resonant circuit 206) including a power transfer element (e.g., the base power transfer element 204 and capacitor C2) as described above. As shown in FIG. 2, inductance may generally be the inductance of the power transfer element, whereas, capacitance may be added to the power transfer element to create a resonant structure at a desired resonant frequency. Accordingly, for larger size power transfer elements using larger diameter coils exhibiting larger inductance, the value of capacitance needed to produce resonance may be lower. Inductance may also depend on a number of turns of a coil. Furthermore, as the size of the power transfer element increases, coupling efficiency may increase. This is mainly true if the size of both base and electric vehicle power transfer elements increase. Furthermore a resonant circuit including a power transfer element and tuning capacitor may be designed to have a high quality (Q) factor to improve energy transfer efficiency. For example, the Q factor may be 300 or greater.

As described above, according to some implementations, coupling power between two power transfer elements that are in the near-field of one another is disclosed. As described above, the near-field may correspond to a region around the power transfer element in which mainly reactive electromagnetic fields exist. If the physical size of the power transfer element is much smaller than the wavelength, inversely proportional to the frequency, there is no substantial loss of power due to waves propagating or radiating away from the power transfer element. Near-field coupling-mode regions may correspond to a volume that is near the physical volume of the power transfer element, typically within a small fraction of the wavelength. According to some implementations, magnetic power transfer elements, such as single and multi-turn conductor loops, are preferably used for both transmitting and receiving since handling magnetic fields in practice is easier than electric fields because there is less interaction with foreign objects, e.g., dielectric objects and the human body. Nevertheless, "electric" power transfer elements (e.g., dipoles and monopoles) or a combination of magnetic and electric power transfer elements may be used.

Figure 3:
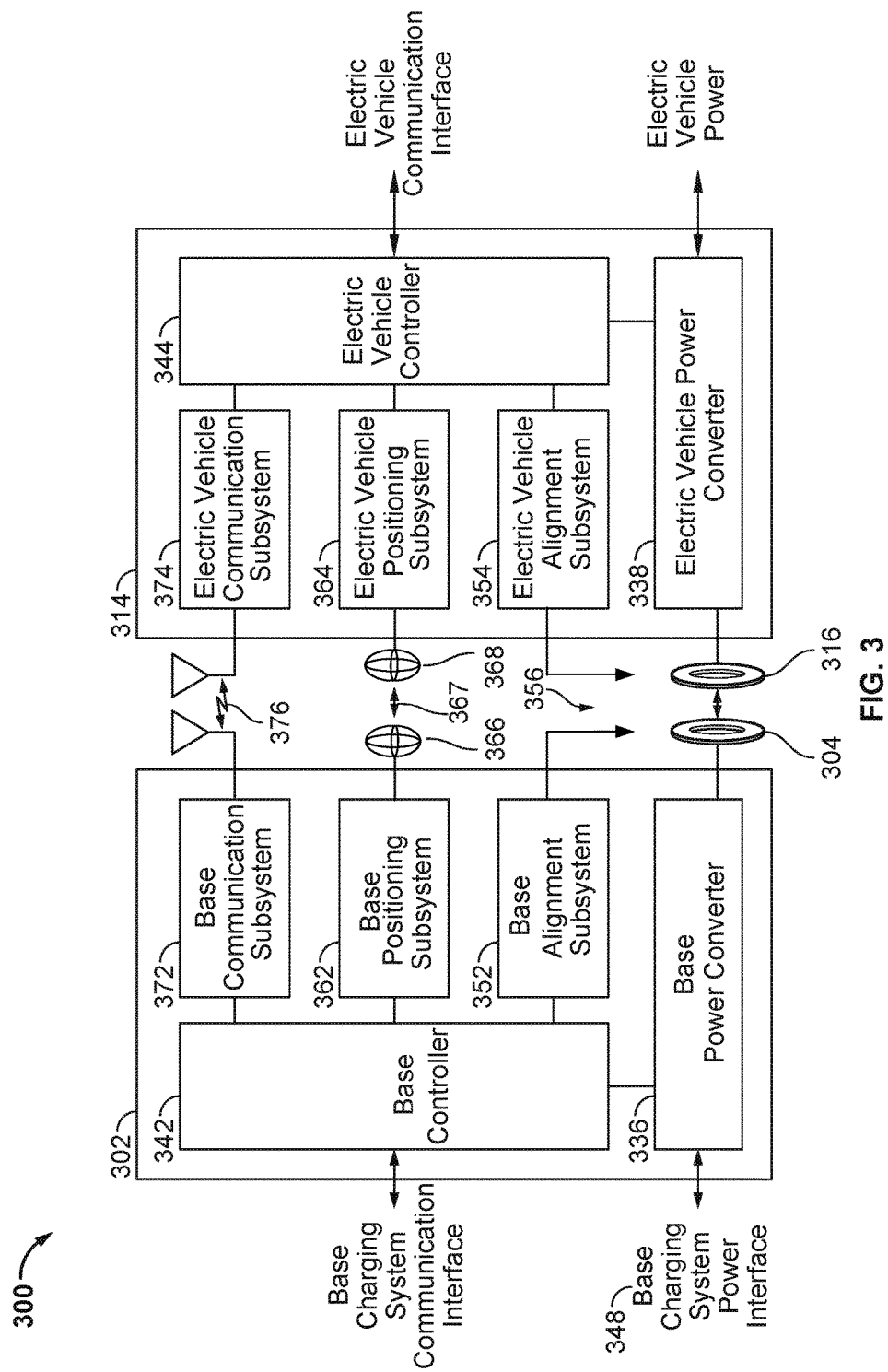
FIG. 3 is a functional block diagram showing exemplary components of a wireless power transfer system, in accordance with certain aspects of the present disclosure.

FIG. 3 is a functional block diagram showing exemplary components of wireless power transfer system 300, which may be employed in wireless power transfer system 100 of FIG. 1 and/or that wireless power transfer system 200 of FIG. 2 may be part of. The wireless power transfer system 300 illustrates a communication link 376, a positioning link 367, using, for example, a magnetic field signal for determining a position or direction, and an alignment mechanism 356 capable of mechanically moving one or both of the base power transfer element 304 and the electric vehicle power transfer element 316. Mechanical (kinematic) alignment of the base power transfer element 304 and the electric vehicle power transfer element 316 may be controlled by the base alignment subsystem 352 and the electric vehicle charging alignment subsystem 354, respectively. The positioning link 367 may be capable of bi-directional signaling, meaning that positioning signals may be emitted by the base positioning subsystem or the electric vehicle positioning subsystem or by both. As described above with reference to FIG. 1, when energy flows towards the electric vehicle 112, in FIG. 3 a base charging system power interface 348 may be configured to provide power to a base power converter 336 from a power source, such as an AC or DC power supply (not shown). The base power converter 336 may receive AC or DC power via the base charging system power interface 348 to drive the base power transfer element 304 at a frequency near or at the resonant frequency of the base resonant circuit 206 with reference to FIG. 2. The electric vehicle power transfer element 316, when in the near-field coupling-mode region, may receive energy from the electromagnetic field to oscillate at or near the resonant frequency of the electric vehicle resonant circuit 222 with reference to FIG. 2. The electric vehicle power converter 338 converts the oscillating signal from the electric vehicle power transfer element 316 to a power signal suitable for charging a battery via the electric vehicle power interface.

The base wireless charging system 302 includes a base controller 342 and the electric vehicle wireless charging system 314 includes an electric vehicle controller 344. The base controller 342 may provide a base charging system communication interface to other systems (not shown) such as, for example, a computer, a base common communication (BCC), a communications entity of the power distribution center, or a communications entity of a smart power grid. The electric vehicle controller 344 may provide an electric vehicle communication interface to other systems (not shown) such as, for example, an on-board computer on the vehicle, a battery management system, other systems within the vehicles, and remote systems.

The base communication subsystem 372 and electric vehicle communication subsystem 374 may include subsystems or circuits for specific application with separate communication channels and also for wirelessly communicating with other communications entities not shown in the diagram of FIG. 3. These communications channels may be separate physical channels or separate logical channels. As non-limiting examples, a base alignment subsystem 352 may communicate with an electric vehicle charging alignment subsystem 354 through communication link 376 to provide a feedback mechanism for more closely aligning the base power transfer element 304 and the electric vehicle power transfer element 316, for example via autonomous mechanical (kinematic) alignment, by either the electric vehicle charging alignment subsystem 354 or the base alignment subsystem 352, or by both, or with operator assistance.

The electric vehicle wireless charging system 314 may further include an electric vehicle positioning subsystem 364 connected to a magnetic field generator 368. The electric vehicle positioning subsystem 364 may be configured to drive the magnetic field generator 368 with currents that generate an alternating magnetic field. The base wireless charging system 302 may include a magnetic field sensor 366 connected to a base positioning subsystem 362. The magnetic field sensor 366 may be configured to generate a plurality of voltage signals under influence of the alternating magnetic field generated by the magnetic field generator 368. The base positioning subsystem 362 may be configured to receive these voltage signals and output a signal indicative of a position estimate and an angle estimate between the magnetic field sensor 366 and the magnetic field sensor 368. These position and angle estimates may be translated into visual and/or acoustic guidance and alignment information that a driver of the electric vehicle may use to reliably park the vehicle. In some implementations, these position and angle estimates may be used to park a vehicle automatically with no or only minimal driver intervention (drive by wire).

Further, electric vehicle controller 344 may be configured to communicate with electric vehicle onboard systems. For example, electric vehicle controller 344 may provide, via the electric vehicle communication interface, position data, e.g., for a brake system configured to perform a semi-automatic parking operation, or for a steering servo system configured to assist with a largely automated parking ("park by wire") that may provide more convenience and/or higher parking accuracy as may be needed in certain applications to provide sufficient alignment between base and electric vehicle power transfer elements 304 and 316. Moreover, electric vehicle controller 344 may be configured to communicate with visual output devices (e.g., a dashboard display), acoustic/audio output devices (e.g., buzzer, speakers), mechanical input devices (e.g., keyboard, touch screen, and pointing devices such as joystick, trackball, etc.), and audio input devices (e.g., microphone with electronic voice recognition).

The wireless power transfer system 300 may also support plug-in charging via a wired connection, for example, by providing a wired charge port (not shown) at the electric vehicle wireless charging system 314. The electric vehicle wireless charging system 314 may integrate the outputs of the two different chargers prior to transferring power to or from the electric vehicle. Switching circuits may provide the functionality as needed to support both wireless charging and charging via a wired charge port.

To communicate between the base wireless charging system 302 and the electric vehicle wireless charging system 314, the wireless power transfer system 300 may use in-band signaling via base and electric vehicle power transfer elements 304, 316 and/or out-of-band signaling via communications systems (372, 374), e.g., via an RF data modem (e.g., Ethernet over radio in an unlicensed band). The out-of-band communication may provide sufficient bandwidth for the allocation of value-add services to the vehicle user/owner. A low depth amplitude or phase modulation of the wireless power carrier may serve as an in-band signaling system with minimal interference.

Some communications (e.g., in-band signaling) may be performed via the wireless power link without using specific communications antennas. For example, the base and electric vehicle power transfer elements 304 and 316 may also be configured to act as wireless communication antennas. Thus, some implementations of the base wireless charging system 302 may include a controller (not shown) for enabling keying type protocol on the wireless power path. By keying the transmit power level (amplitude shift keying) at predefined intervals with a predefined protocol, the receiver may detect a serial communication from the transmitter. The base power converter 336 may include a load sensing circuit (not shown) for detecting the presence or absence of active electric vehicle power receivers in the near-field coupling mode region of the base power transfer element 304. By way of example, a load sensing circuit monitors the current flowing to a power amplifier of the base power converter 336, which is affected by the presence or absence of active power receivers in the near-field coupling mode region of the base power transfer element 304. Detection of changes to the loading on the power amplifier may be monitored by the base controller 342 for use in determining whether to enable the base wireless charging system 302 for transmitting energy, to communicate with a receiver, or a combination thereof.

In some implementations, the wireless power transfer system 100 and/or wireless power transfer system 200 may be employed in a system for wirelessly charging electric vehicles, such as a wireless electric vehicle charging (WEVC) system. For example, base power transfer element 104 may be included within a wireless power transfer pad that may be used to wirelessly deliver power to an electric vehicle. In certain WEVC systems, such as large scale car-park environments, numerous wireless power transfer pads may be distributed throughout the environment (e.g., different parking spaces) and used to charge wireless vehicles (e.g., while these vehicles are parked). It should be noted that while aspects of the present disclosure are described with respect to a WEVC system, these aspects may also be performed with other wireless power transfer systems with multiple wireless power transfer pads or other power transfer elements.

Figure 4:
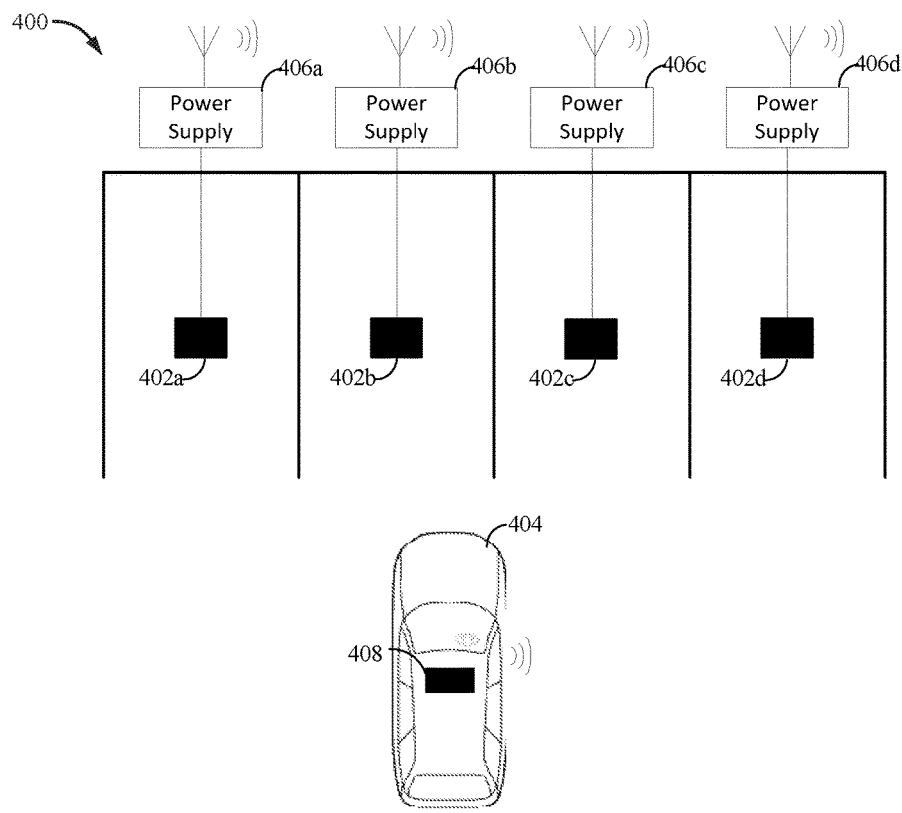
FIG. 4 illustrates an example large scale car-park environment employing a wireless electric vehicle charging (WEVC) system, in accordance with certain aspects of the present disclosure.

FIG. 4 illustrates an example large scale car-park environment 400 employing a WEVC system in which aspects of the present disclosure may be practiced. As noted above, a plurality of wireless power transfer pads 402*a-d* may be distributed throughout the environment 400, for example, in different parking spots. The wireless power transfer pads 402*a-d* may be used to wirelessly charge electric vehicles, such as electric vehicle 404. For example, wireless power transfer pads 402*a-d* may be connected to a power supply 406*a-d* (e.g., local power source 130), which may supply power to the wireless power transfer pads 402*a-d*. The wireless power transfer pads 402*a-d* may deliver power wirelessly to the electric vehicle 404, for example, using one or more techniques described herein. According to aspects, a wireless power transfer pad 408 on the electric vehicle 404 may receive the wirelessly transmitted power and may store the power in a battery (not shown). In some cases, power supplies 406*a-d* may communicate with each other to coordinate the wireless transmission of power, for example, using techniques described herein. In some cases, the power supplies 406*a-d* communicate with each other over a hardwire cable (not shown) or via one or more antennas.

In some implementations, wireless power transfer pads may be placed separately from one another and controlled separately. For example, wireless power transfer pads may not be within "magnetic" distance of each other (e.g., the wireless power transfer pads are placed far enough apart such that their respective magnetic fields do not substantially interact/couple with each other), and as such, each wireless power transfer pad can be operated in isolation. However, in some implementations, multiple wireless power transfer pads may be placed within magnetic distance of one another (e.g., the wireless power transfer pads are placed at a distance where their respective magnetic fields substantially interact/couple with each other). For example, in car parking buildings or high-density parking for electric vehicles (e.g., autonomous vehicles) parking spots, each having a wireless power transfer pad, may be close to one another and may lead to arrangements where multiple wireless power transfer pads are within magnetic distance of one another (e.g., as illustrated in FIG. 4). When multiple wireless power transfer pads are operated together, there is a potential for each to interact negatively with each other.

Moreover, in some cases, the WVEC system illustrated in the large scale car park environment 400 may be employed in a semi-dynamic or dynamic system. In such a system, multiple wireless power transfer pads may be disposed within a street and may be used to power the electric vehicle 404 as the electric vehicle 404 drives along the street. For example, to power the electric vehicle 404, the WVEC system may dynamically activate wireless power transfer pads as the electric vehicle 404 passes over, allowing each of these wireless power transfer pads to couple with the electric vehicle 404 and wirelessly transmit power. However, as noted above, these wireless power transfer pads may be capable of magnetically coupling with each other and negatively interacting, which occurs dynamically as these wireless power transfer pads are activated and deactivated.

Thus, certain aspects described herein provide techniques for controlling operations of multiple wireless power transfer pads together, for example, to reduce negative interactions between the multiple wireless power transfer pads.

Figure 5:
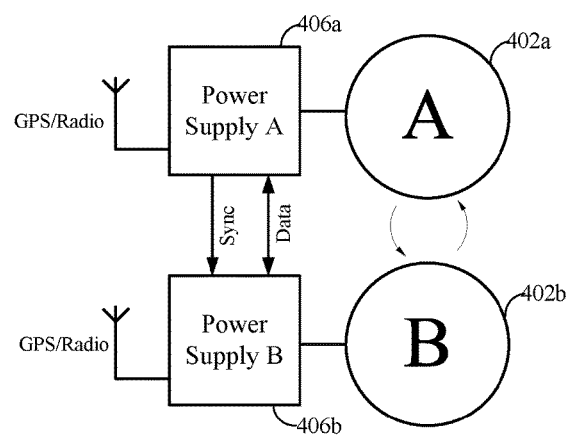
FIG. 5 illustrates a scenario of coupling when two (or more) wireless power transfer pads are located in close proximity of each other, in accordance with certain aspects of the present disclosure.

FIG. 5 illustrates a scenario of coupling where two (or more) wireless power transfer pads are located in close proximity of each other, according to aspects of the present disclosure. According to aspects, if wireless power transfer pads 402a and 402b are within magnetic distance to one another there may be an amount of coupling between wireless power transfer pads 402a and 402b, which may lead to power transfer between the two pads and accordingly a loss of system efficiency. In some cases, the power transfer between wireless power transfer pads 402a and 402b may be caused by a mismatch in the operating phases (e.g., absolute phase of the resonant current output by each of the wireless power transfer pads 402a and 402b) of the wireless power transfer pads 402a and 402b. For example, if the phase of wireless power transfer pad 402a is different from the phase of the wireless power transfer pad 402b (e.g., phase of wireless power transfer pad 402a=0° and phase of wireless power transfer pad 402b=90°), power transfer between the two wireless power transfer pads may occur, which may lead to inefficiencies. In some aspects, even small phase differences may result in inefficiencies. In some cases this may only result in reduced efficiency, but in some cases, the power transfer between wireless power transfer pads 402a and 402b may cause erratic operation or failure of the wireless power transfer pads 402a and 402b.

In certain WEVC systems, including multiple wireless power transfer pads 402, the level of power transferred by each of the wireless power transfer pad 402 may be measured and used to determine whether a vehicle is present over the wireless power transfer pad 402. If a vehicle is determined as present over a given wireless power transfer pad 402, wireless power transfer pad 402 may be enabled to transfer power. If a vehicle is determined as not present over a given wireless power transfer pad 402, wireless power transfer pad 402 may be disabled from transferring power. However, in such a WEVC system, if a given wireless power transfer pad 402a is transferring or receiving power to/from an adjacent wireless power transfer pad 402b, this may result in a significant offset in the power measurement at each of the wireless power transfer pads 402a and 402b, which may cause an error in detecting presence of a vehicle or may change a sensitivity level used for making the detection determination, thereby limiting operational conditions (e.g., power transferred, Z height of the wireless power transfer pads, offset between wireless power transfer pads) that can be supported by the WEVC system. For example, false positives in the vehicle detection may cause a wireless power transfer pad 402 to remain generating a wireless field after the vehicle has departed.

In some cases, even if the pads are far enough apart such that power transfer between them is negligible, the wireless power transfer pads 402a and 402b may still interact, causing issues. Accordingly, any ancillary systems that utilize power transfer information of the wireless power transfer pad 402 (e.g., alignment, foreign object detection (FOD), etc.) may not function properly. In particular, the phase and frequency of an adjacent wireless power transfer pad may be variable (i.e., non-constant), which may affect operation of the WEVC system. Additionally, there may be certain configurations of phase and frequency that are undesirable from a compliance standpoint (such as constructive interference).

Thus, aspects of the present disclosure propose techniques to improve the operation of WEVC systems where wireless power transfer pads are located in close proximity to each other, such as large car-park scenarios. For example, aspects of the present disclosure provide techniques for synchronizing the operating phases of multiple wireless power transfer pads. In particular, the multiple wireless power transfer pads may be synchronized to output a wireless charging signal at substantially the same phase for the resonant current of the wireless charging signal.

In certain aspects, the operating phases of wireless power transfer pads 402 can be synchronized using a global or locally provided synchronization signal to avoid power transfer between the wireless power transfer pads 402. For example, the current supplied to a wireless power transfer pad 402 by a power supply 406 may be generated with a phase based on the synchronization signal so that wireless power transfer pads 402 may operate at approximately the same phase. Such a synchronization signal may synchronize operating phases between wireless power transfer pads 402 located near each other but transmission and buffering delays for transmitting/receiving the synchronization signal may cause the synchronization signal to be received at different times by the wireless power transfer pads 402, leading to a phase offset between the wireless power transfer pads 402. For example, the phase indicated by the synchronization signal at each of the wireless power transfer pads 402 may be different based on the transmission and buffering delays. For example, where wireless power transfer pads are separated by approximately 50 m from each other, with a cable length of more than 60 m between wireless transfer pads, there may be a 250 ns delay in transmission over the cable alone, which corresponds to a roughly 8 degree lag for a wireless field operating at a frequency of 85 kHz. In some aspects, using a frequency other than the fundamental frequency for synchronization may add significant complexity.

Further, in certain aspects, there may be a difference between the phase of control signals (e.g., from power supply 406) for generating the resonant current at the wireless power transfer pads 402 and the actual phase of the resonant current at the wireless power transfer pad 402. For example, the phase difference may be caused by changes to the tuning frequency of the wireless power transfer pad, changes in loading, etc. Accordingly, in certain aspects, to correct for the error between control signals and the actual phase of the resonant current at the wireless power transfer pad, the phase of the resonant current at the wireless power transfer pad may be measured (e.g., by phase measurement and correction circuit 610) and then compared to the phase of the synchronization signal. An error signal may then be generated and used to adjust the phase of the current supplied to the wireless power transfer pad 402, correcting the absolute phase of the resonant current. In certain aspects, the phase measurement and correction circuit 610 may have tunable parameters to allow the correction in phase to happen smoothly and with reduced perturbations.

Figure 6:
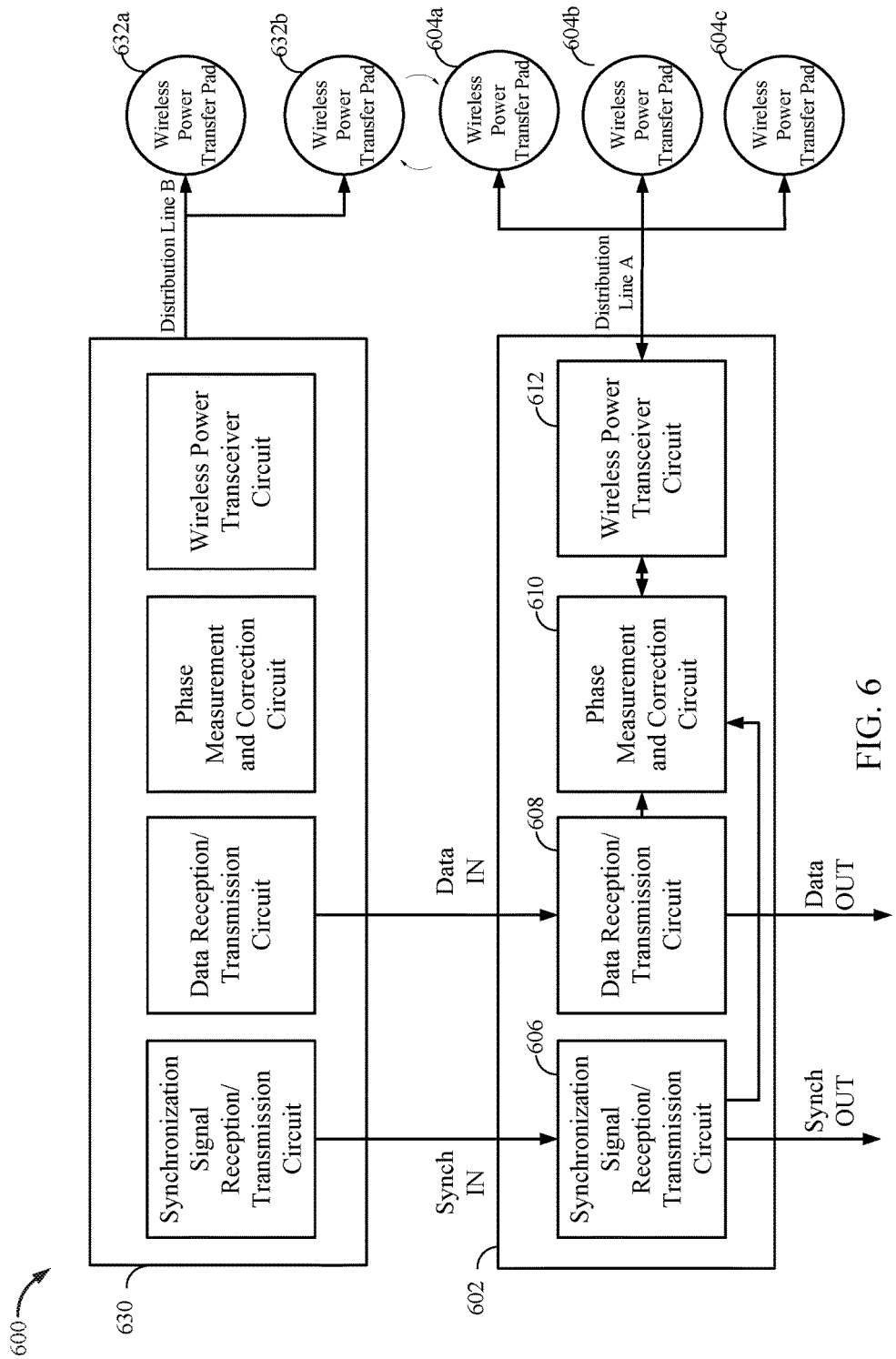
FIG. 6 is a functional block diagram of a WEVC control system, in accordance with certain aspects of the present disclosure.

FIG. 6 is a functional block diagram of a WEVC control system 600, which includes a power supply 602 and a power supply 630 that may be configured to supply power to one or more electric vehicles via one or more wireless power transfer pads (e.g., wireless power transfer pads 604a-604c and 632a-632b), according to aspects described herein. As illustrated, the power supply 602 includes a synchronization signal reception/transmission circuit 606, a data reception/transmission circuit 608, a phase measurement and correction circuit 610, and a wireless power transceiver circuit 612. Power supply 630 may include the same or similar components/circuits as the power supply 602.

According to aspects, the synchronization signal reception/transmission circuit 606 is configured to receive a synchronization signal, indicating a phase to use for transferring power to a device (e.g., electric vehicle) via the wireless power transfer pad 604. For example, the power supply 602 may utilize the synchronization signal to control the phase at the wireless power transfer pad 604. The synchronization signal reception/transmission circuit 606 may receive the synchronization signal via wired or wireless communications from a common source (e.g., a system controller, a particular wireless power transfer pad, etc.), or may receive and pass the synchronization signal to a next wireless power transfer pad (e.g., power supply 630 passes the synchronization signal to power supply 602). In some aspects, the synchronization signal works sufficiently when the wireless power transfer pads to be synchronized are located near each other but transmission and buffering delays can cause issues where the wireless power transfer pads are further apart or the path for the synchronization signal is convoluted.

According to aspects, to solve these issues, the phase based on the synchronization signal received at each power supply in the WEVC system may be adjusted and the adjusted phase used to generate current to power wireless power transfer pads such that phases between wireless power transfer pads are in synch. According to aspects, the amount of phase adjustment for a given wireless power transfer pad to a phase based on the synchronization signal may be pre-programmed as a fixed offset based on certain parameters such as a distance between the synchronization signal source and the wireless power transfer pad, properties of the wireless power transfer pad such as an error between control signal for generating current and actual resonant current output, etc. Such aspects, however, may have limited use and inflexibility. Accordingly, in some aspects certain parameters of wireless transfer pads may be measured and used to adjust the amount of phase adjustment for each wireless power transfer pad as described further herein.

According to aspects, components of the wireless power transfer pads (e.g., 604a-c and 632a-b) (e.g., power transfer element) and/or power supplies 602 and 630 can be used for making different measurements that can be used to determine an adjusted operating phase for the wireless power transfer pads. For example, a wireless power transfer pad 604a may be supplied a current (e.g., with a phase based on a synchronization signal) by a respective power supply 602, 630 and generate a wireless power field with a resonant current. Adjacent wireless power transfer pad 632b (e.g., adjacent to wireless power transfer pad 604a) may couple to the wireless power field generated by wireless power transfer pad 604a and its power supply 630 may measure both phase and magnitude information of the received wireless power field by the phase measurement and correction circuit 610. The power supply 630 may pass the phase and/or magnitude information to the power supply 602, and the phase measurement and correction circuit 610 of the power supply 602 may further adjust the phase of the current supplied to the wireless power transfer pad 604a based on the measured phase and/or magnitude information of the wireless power transfer pad 604a to reduce a magnitude of power received at the wireless power transfer pad 632b.

In certain aspects, adjacent pads, wireless power transfer pads 604a and 632b, are energized (e.g., by their respective wireless power transceiver circuits) and generate a wireless power field at the same time. The phase measurement and correction circuit (e.g., 610) may then measure the total real power received at each of wireless power transfer pads 604a and 632b. The loss in real power at the wireless power transfer pads 604a and 632b pads can be characterized by energizing each pad (e.g., 604a), followed by energizing the adjacent pad (e.g., 632b) and measuring the loss in real power between one pad being energized and both pads being energized. The phase can then be adjusted by the phase measurement and correction circuit 610 until this loss in real power is minimized or reduced. According to aspects, based on these types of measurements, an error signal may be generated by the phase measurement and correction circuit 610 that can be used to adjust the phase of the control signals output from the wireless power transceiver circuit 612, allowing the absolute phase of the resonant current in the wireless power transfer pads (e.g., 604a-c) to be corrected. This measurement procedure will be described in greater detail below.

As noted, an amount of phase adjustment for a particular wireless power transfer pad versus a received synchronization signal may be determined based on various measurements made at one or more power supplies. For example, the phase measurement and correction circuit 610 may measure the phase of the current in a distribution line A between the power supply 602 and wireless power transfer pads 604. The power supply 602 may then receive information regarding another phase measurement for distribution line B from an adjacent power supply, such as power supply 630 (which supplies power to wireless power transfer pads 632a-632b). That is, the adjacent power supply 630 may transmit data, including an indication of the phase of distribution line B, which may be received at the Data Reception/Transmission Circuit 608 of the power supply 602. As noted, this data transmission may be made over a hard wire or wirelessly.

According to aspects, the phase measurement and correction circuit 610 may receive information regarding the phase measurement of the adjacent power supply 630. The phase measurement and correction circuit 610 may then compare the phase of the current in distribution line A and the phase of the current in distribution line B, and manually or automatically determine an adjusted operating phase for the wireless power transfer pads 604a-c. Based on the adjusted operating phase, the wireless power transceiver circuit 612 may correct the phase of the current supplied to the wireless power transfer pads 604a-604c such that the operating phases of these wireless power transfer pads are in synch (e.g., approximately the same).

In some cases, as wireless power transfer pads 604a and 632b experience coupling (e.g., as illustrated by the curved arrows), correction of the phase based on the synchronization signal may be based on the phases in each of these wireless power transfer pads. For example, the phase measurement and correction circuit in power supply 630 may measure the phase of the current in the wireless power transfer pad 632b. Power supply 630 may then transmit data to power supply 602, including an indication of the phase of the current in wireless power transfer pad 632b. The phase measurement and correction circuit 610 in power supply 602 may then measure the phase of the current supplied to wireless power transfer pad 604a. The phase measurement and correction circuit 610 may then compare the phase of the current in wireless power transfer pad 604a with the phase of the current in wireless power transfer pad 632b, and manually or automatically determine an adjusted operating phase at which to operate the wireless power transfer pad 604a (e.g., to match the phase of the wireless power transfer pad 632b). Based on the adjusted operating phase, the wireless power transceiver circuit 612 may correct the phase of the current supplied to the wireless power transfer pads 604a-604c.

In some cases, correction of the operating phase of wireless power transfer pads may be based on the phase of the mutually coupled flux between wireless power transfer pads (e.g., wireless power transfer pads 604a and 632b). For example, in some cases, phase measurement and correction circuit 610 may be configured to measure the mutually coupled flux between wireless power transfer pads 604a and 632b. For example, in this case, the wireless power transceiver circuit in the power supply 630 may be configured to energize wireless power transfer pad 632b. Phase measurement and correction circuit 610 may then use wireless power transfer pad 604a to measure the phase of the mutually coupled flux between wireless power transfer pads 604a and 632b. Based on this measurement, the phase measurement and correction circuit 610 may determine an adjusted operating phase at which to operate the wireless power transfer pads 604a-c (e.g., to match the phase of the wireless power transfer pad 632b). The wireless power transceiver circuit 612 may correct the phase of the current supplied to the wireless power transfer pads 604a-604c based on the adjusted operating phase.

In some cases, the measurement of the phase of the mutually coupled flux may be repeated in reverse at the power supply 630 to confirm or enhance the accuracy measurement. That is, wireless power transceiver circuit 612 may be configured to energize wireless power transfer pad 604a. The phase measurement and correction circuit in power supply 630 may then use wireless power transfer pad 632b to measure the phase of the mutually coupled flux between the two wireless power transfer pads. Power supply 630 may then transmit an indication of the phase of the mutually coupled flux to the power supply 602, which may be used to enhance the determination of the adjusted operating phase in the power supply 602.

In some cases, correction of the operating phase of wireless power transfer pads may be based on the cross-coupled power transferred between wireless power transfer pads (e.g., wireless power transfer pads 604a and 632b). According to aspects, in this case, power supply 630 may be configured to energize wireless power transfer pad 632b and power supply 602 may be configured to energize wireless power transfer pad 604a. Phase measurement and correction circuit 610 may then measure the cross-coupled power between the two wireless power transfer pads. The wireless power transceiver circuit 612 may then adjust the operating phase of the wireless power transfer pad 604a until power transfer between wireless power transfer pad 604a and 632b is minimized or reduced.

According to aspects, since the operating phase is adjusted based on measurements in addition to the synchronization signal itself, the synchronization signal may not need to be as accurate between devices. For example, in some aspects, the frequency of the synchronization signal may be different from the fundamental system operating frequency of the wireless power transfer pads. For example, a lower the frequency for the synchronization signal may allow the synchronization signal to travel over longer distances and have higher immunity to noise generated by the "alternate current" (AC) side of the WEVC system. Additionally, in some cases, a higher frequency for the synchronization signal may allow the synchronization signal to have higher immunity to noise generated by the "direct current" (DC) side of the WEVC system. In certain aspects, the frequency may be an unconventional multiple of the system operating frequency, or even be completely free-form, if the system is able to maintain an accurate clock from the sync signal.

In certain aspects, the synchronization signal could be either a completely external source that is being synchronized to (such as GPS, time sync signaling, a global wireless signal for the installation etc.) or another unconventional source such as digital control data packets in a low jitter, defined transport time data bus such as ethercat or RS422.

According to aspects, with a system that can periodically or continuously monitor the phase and magnitude of the resonant currents in the system, this information can be used for other purposes, as well. For example, checking the relative phase of adjacent wireless power transfer pads can provide verification of correct system tuning and overall phase at deployment or initialization. This can uncover common problems such as mis-wired or misconnected wireless power transfer pads, incorrect tuning arrays and provides an additional way of verifying the correctness of feedback signals.

Additionally, in some cases, it is possible to use the relative phase of the resonant current with a drive signal to monitor system tuning during operation in order to track any changes over time. Long term changes can indicate stress-induced aging of components while short term changes can indicate component damage or failure.

Further, once the system phase (i.e., synchronization signal phase) is controllable, it is possible to have more complex arrangements such as having adjacent pads be operated in quadrature during alignment mode, which would allow a vehicle to receive separate alignment information for 2 separate pads simultaneously, if provided with an accurate common reference.

Figure 7:
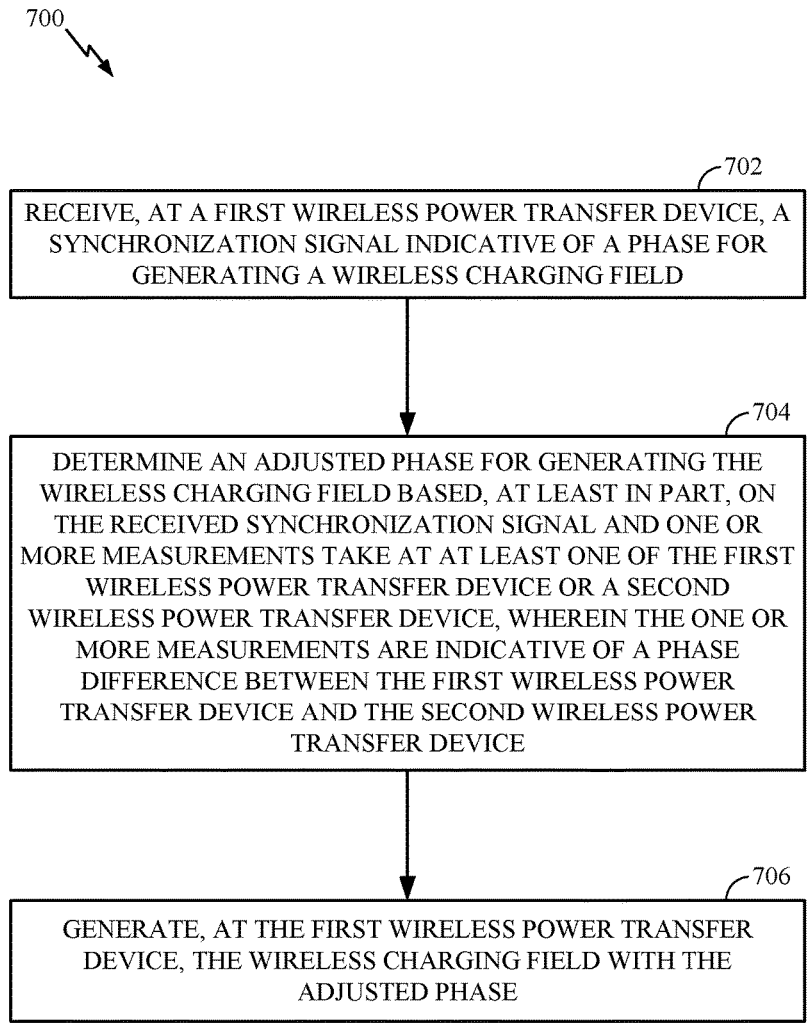
FIG. 7 illustrates example operations for powering a wireless device, in accordance with certain aspects of the present disclosure.

FIG. 7 illustrates example operations 700 for powering a wireless device. According to aspects, operations 700 may be performed by a power supply (e.g., power supply 602), or one or more components within the power supply, used to supply power to the wireless device via one or more wireless power transfer pads.

Operations 700 begin at 702 by receiving, at a first wireless power transfer device, a synchronization signal indicative of a phase for generating a wireless charging field. At 704, the power supply determines an adjusted phase for generating the wireless charging field based, at least in part, on the received synchronization and one or more measurements taken at at least one of the first wireless power transfer device or a second wireless power transfer device, for example, using aspects described above. According to aspects, the one or more measurements may be indicative of a phase difference between the first wireless power transfer device and the second wireless power transfer device At 706, the power supply generates, at the first wireless power transfer device, the wireless charging field with the adjusted phase.

The various operations of methods described above may be performed by any suitable means capable of performing the corresponding functions. The means may include various hardware and/or software component(s) and/or module(s), including, but not limited to a circuit, an application-specific integrated circuit (ASIC), or processor. Generally, where there are operations illustrated in figures, those operations may have corresponding counterpart means-plus-function components with similar numbering.

For example, means for receiving may comprise a synchronization signal reception/transmission circuit 606. Means for determining, means for performing, means for measuring, and/or means for using may comprise a phase measurement and correction circuit 610. Means for generating and/or means for energizing may comprise a wireless power transfer element, such as the wireless power transceiver circuit 612. In some cases, the synchronization signal reception/transmission circuit 606, the phase measurement and correction circuit 610, and/or the wireless power transceiver circuit 612 may comprise one or more processors or other hardware components, such as described below.

As used herein, the term "determining" encompasses a wide variety of actions. For example, "determining" may include calculating, computing, processing, deriving, investigating, looking up (e.g., looking up in a table, a database, or another data structure), ascertaining, and the like. Also, "determining" may include receiving (e.g., receiving information), accessing (e.g., accessing data in a memory), and the like. Also, "determining" may include resolving, selecting, choosing, establishing, and the like.

As used herein, a phrase referring to "at least one of" a list of items refers to any combination of those items, including single members. As an example, "at least one of: a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The various illustrative logical blocks, modules and circuits described in connection with the present disclosure may be implemented or performed with a general purpose processor, a digital signal processor (DSP), an ASIC, a field programmable gate array (FPGA) or other programmable logic device (PLD), discrete gate or transistor logic, discrete hardware components, or any combination thereof designed to perform the functions described herein. A general-purpose processor may be a microprocessor, but in the alternative, the processor may be any commercially available processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

The functions described may be implemented in hardware, software, firmware, or any combination thereof. If implemented in hardware, an example hardware configuration may comprise a processing system in a wireless node.

The processing system may be implemented with a bus architecture. The bus may include any number of interconnecting buses and bridges depending on the specific application of the processing system and the overall design constraints. The bus may link together various circuits including a processor, machine-readable media, and a bus interface. The bus interface may be used to connect a network adapter, among other things, to the processing system via the bus. The network adapter may be used to implement the signal processing functions of the physical (PHY) layer. In the case of a user terminal, a user interface (e.g., keypad, display, mouse, joystick, etc.) may also be connected to the bus. The bus may also link various other circuits such as timing sources, peripherals, voltage regulators, power management circuits, and the like, which are well known in the art, and therefore, will not be described any further.

The processing system may be configured as a general-purpose processing system with one or more microprocessors providing the processor functionality and external memory providing at least a portion of the machine-readable media, all linked together with other supporting circuitry through an external bus architecture. Alternatively, the processing system may be implemented with an ASIC with the processor, the bus interface, the user interface in the case of an access terminal), supporting circuitry, and at least a portion of the machine-readable media integrated into a single chip, or with one or more FPGAs, PLDs, controllers, state machines, gated logic, discrete hardware components, or any other suitable circuitry, or any combination of circuits that can perform the various functionality described throughout this disclosure. Those skilled in the art will recognize how best to implement the described functionality for the processing system depending on the particular application and the overall design constraints imposed on the overall system.

It is to be understood that the claims are not limited to the precise configuration and components illustrated above. Various modifications, changes and variations may be made in the arrangement, operation and details of the methods and apparatus described above without departing from the scope of the claims.

What is claimed is:

1. A method for wireless power transfer, comprising:
    energizing a first wireless power transfer device;
    receiving, at the first wireless power transfer device, a synchronization signal indicative of a phase for generating a wireless charging field;
    using a second wireless power transfer device to measure a mutually coupled flux between the first wireless power transfer device and the second wireless power transfer device;
    determining an adjusted phase for generating the wireless charging field based, at least in part, on the received synchronization signal and one or more measurements taken at the first wireless power transfer device or the second wireless power transfer device, the one or more measurements including at least the mutually coupled flux, the one or more measurements indicating a phase difference between the first wireless power transfer device and the second wireless power transfer device; and
    generating, at the first wireless power transfer device, the wireless charging field with the adjusted phase.

2. The method of claim 1, further comprising:
measuring a first phase in a first distribution line used to supply power between the first wireless power transfer device and a first power supply; and
measuring a second phase in a second distribution line used to supply power between the second wireless power transfer device and a second power supply, wherein the one or measurements comprise the first phase and the second phase, wherein the determining of the adjusted phase for generating the wireless charging field is further based on a comparison of the first phase and the second phase.

3. The method of claim 1, further comprising:
measuring a first phase in the first wireless power transfer device; and
measuring a second phase in the second wireless power transfer device, wherein the one or measurements comprise the first phase and the second phase, wherein the determining of the adjusted phase for generating the wireless charging field is further based on a comparison of the first phase and the second phase.

4. The method of claim 1, further comprising:
energizing the second wireless power transfer device; and
using the first wireless power transfer device to additionally measure the mutually coupled flux between the first wireless power transfer device and the second wireless power transfer device, wherein the one or more measurements comprise the additionally measured mutually coupled flux.

5. The method of claim 1, further comprising:
receiving information regarding a first phase in a first distribution line used to supply power between the first wireless power transfer device and a first power supply; and
receiving information regarding a second phase in a second distribution line used to supply power between the second wireless power transfer device and a second power supply, wherein the one or measurements comprise the first phase and the second phase.

6. The method of claim 1, further comprising:
receiving information regarding a first phase in the first wireless power transfer device; and
receiving information regarding a second phase in the second wireless power transfer device, wherein the one or measurements comprise the first phase and the second phase, wherein the determining of the adjusted phase for generating the wireless charging field is further based on a comparison of the first phase and the second phase.

7. A method for wireless power transfer, comprising:
energizing a first wireless power transfer device;
receiving, at the first wireless power transfer device, a synchronization signal indicative of a phase for generating a wireless charging field;
measuring cross-coupled power transferred between the first wireless power transfer device and a second wireless power transfer device when the second wireless power transfer device is energized;
determining an adjusted phase for generating the wireless charging field based, at least in part, on the received synchronization signal and one or more measurements taken at the first wireless power transfer device or a second wireless power transfer device, the one or more measurements including at least the cross-coupled power, the one or more measurements indicating a phase difference between the first wireless power transfer device and the second wireless power transfer device; and
generating, at the first wireless power transfer device, the wireless charging field with the adjusted phase.

8. The method of claim 7, wherein determining the adjusted phase based on the cross-coupled power comprises adjusting a phase of a current supplied to the first wireless power transfer device until the cross-coupled power transferred between the first wireless power transfer device and the second wireless power transfer device is minimized.

9. The method of claim 7, further comprising:
measuring mutually coupled flux between the first wireless power transfer device and the second wireless power transfer device when at least one of the first wireless power transfer device or the second wireless power transfer device is energized, wherein the one or more measurements comprise the measured mutually coupled flux.

10. An apparatus for wireless power transfer, comprising:
at least one processor configured to:
energize a first wireless power transfer device;
receive, at the first wireless power transfer device, a synchronization signal indicative of a phase for generating a wireless charging field;
use a second wireless power transfer device to measure a mutually coupled flux between the first wireless power transfer device and the second wireless power transfer device; and
determine an adjusted phase for generating the wireless charging field based, at least in part, on the received synchronization signal and one or more measurements taken at the first wireless power transfer device or the second wireless power transfer device, the one or more measurements including at least the mutually coupled flux, the one or more measurements indicating a phase difference between the first wireless power transfer device and the second wireless power transfer device; and
a wireless power transfer element configured to generate, at the first wireless power transfer device, the wireless charging field with the adjusted phase.

11. The apparatus of claim 10, wherein the at least one processor is further configured to:
measure a first phase in a first distribution line used to supply power between the first wireless power transfer device and a first power supply;
measure a second phase in a second distribution line used to supply power between the second wireless power transfer device and a second power supply, wherein the one or more measurements comprise the first phase and the second phase; and
use a comparison of the first phase and the second phase to determine the adjusted phase.

12. The apparatus of claim 10, wherein the at least one processor is further configured to:
measure a first phase in the first wireless power transfer device;
measure a second phase in the second wireless power transfer device, wherein the one or more measurements comprise the first phase and the second phase; and
use a comparison of the first phase and the second phase to determine the adjusted phase.

13. The apparatus of claim 10, wherein the at least one processor is further configured to:

energize the second wireless power transfer device; and
use the first wireless power transfer device to additionally measure the mutually coupled flux between the first wireless power transfer device and the second wireless power transfer device, wherein the one or more measurements further comprise the additionally measured mutually coupled flux.

14. The apparatus of claim 10, wherein the at least one processor is further configured to:
receive information regarding a first phase in a first distribution line used to supply power between the first wireless power transfer device and a first power supply; and
receive information regarding a second phase in a second distribution line used to supply power between the second wireless power transfer device and a second power supply, wherein the one or measurements comprise the first phase and the second phase.

15. The apparatus of claim 10, wherein the at least one processor is further configured to:
receive information regarding a first phase in the first wireless power transfer device; and
receive information regarding a second phase in the second wireless power transfer device, wherein the one or measurements comprise the first phase and the second phase.

16. An apparatus for wireless power transfer, comprising:
at least one processor configured to:
energize a first wireless power transfer device and a second wireless power transfer device;
receive, at the first wireless power transfer device, a synchronization signal indicative of a phase for generating a wireless charging field;
measure cross-coupled power transferred between the first wireless power transfer device and the second wireless power transfer device; and
determine an adjusted phase for generating the wireless charging field based, at least in part, on the received synchronization signal and one or more measurements taken at the first wireless power transfer device or the second wireless power transfer device, the one or more measurements including at least the cross-coupled power, the one or more measurements indicating a phase difference between the first wireless power transfer device and the second wireless power transfer device; and
a wireless power transfer element configured to generate, at the first wireless power transfer device, the wireless charging field with the adjusted phase.

17. The apparatus of claim 16, wherein the at least one processor is further configured to determine the adjusted phase based further on the cross-coupled power by adjusting a phase of a current supplied to the first wireless power transfer device until the cross-coupled power transferred between the first wireless power transfer device and the second wireless power transfer device is minimized.

18. The apparatus of claim 16, wherein the at least one processor is further configured to:
measure mutually coupled flux between the first wireless power transfer device and the second wireless power transfer device when at least one of the first wireless power transfer device or the second wireless power transfer device is energized, wherein the one or more measurements further comprise the measured mutually coupled flux.

19. An apparatus for wireless power transfer, comprising:
means for energizing a first wireless power transfer device;
means for receiving, at the first wireless power transfer device, a synchronization signal indicative of a phase for generating a wireless charging field;
means for using a second wireless power transfer device to measure a mutually coupled flux between the first wireless power transfer device and the second wireless power transfer device;
means for determining an adjusted phase for generating the wireless charging field based, at least in part, on the received synchronization signal and one or more measurements taken at the first wireless power transfer device or the second wireless power transfer device, the one or more measurements including at least the mutually coupled flux, the one or measurements indicating a phase difference between the first wireless power transfer device and the second wireless power transfer device; and
means for generating, at the first wireless power transfer device, the wireless charging field with the adjusted phase.

20. The apparatus of claim 19, further comprising:
means for measuring a first phase in a first distribution line used to supply power between the first wireless power transfer device and a first power supply; and
means for measuring a second phase in a second distribution line used to supply power between the second wireless power transfer device and a second power supply, wherein the one or more measurements comprise the first phase and the second phase.

21. The apparatus of claim 19, further comprising:
means for measuring a first phase in the first wireless power transfer device; and
means for measuring a second phase in the second wireless power transfer device, wherein the one or more measurements comprise the first phase and the second phase.

22. The apparatus of claim 19, further comprising:
means for receiving information regarding a first phase in a first distribution line used to supply power between the first wireless power transfer device and a first power supply; and
means for receiving information regarding a second phase in a second distribution line used to supply power between the second wireless power transfer device and a second power supply, wherein the one or measurements comprise the first phase and the second phase.

23. The apparatus of claim 19, further comprising:
means for receiving information regarding a first phase in the first wireless power transfer device; and
means for receiving information regarding a second phase in the second wireless power transfer device, wherein the one or measurements comprise the first phase and the second phase.

24. A non-transitory computer-readable medium for wireless power transfer, comprising instructions, that when executed by at least one processor, cause the at least one processor to:
energize a first wireless power transfer device;
receive, at the first wireless power transfer device, a synchronization signal indicative of a phase for generating a wireless charging field;
use a second wireless power transfer device to measure a mutually coupled flux between the first wireless power transfer device and the second wireless power transfer device;

determine an adjusted phase for generating the wireless charging field based, at least in part, on the received synchronization signal and one or more measurements taken at the first wireless power transfer device or the second wireless power transfer device, the one or more measurements including the mutually coupled flux, the one or more measurements indicating a phase difference between the first wireless power transfer device and the second wireless power transfer device; and generate, at the first wireless power transfer device, the wireless charging field with the adjusted phase.

25. An apparatus for wireless power transfer, comprising:

means for energizing a first wireless power transfer device and a second wireless power transfer device;

means for receiving, at the first wireless power transfer device, a synchronization signal indicative of a phase for generating a wireless charging field;

means for measuring cross-coupled power transferred between the first wireless power transfer device and the second wireless power transfer device;

means for determining an adjusted phase for generating the wireless charging field based, at least in part, on the received synchronization signal and one or more measurements taken at the first wireless power transfer device or the second wireless power transfer device, the one or more measurements including at least the cross-coupled power, the one or more measurements indicating a phase difference between the first wireless power transfer device and the second wireless power transfer device; and means for generating, at the first wireless power transfer device, the wireless charging field with the adjusted phase.

26. The apparatus of claim 25, further comprising:

means for measuring mutually coupled flux between the first wireless power transfer device and the second wireless power transfer device when at least one of the first wireless power transfer device or the second wireless power transfer device is energized, wherein the one or more measurements comprise the measured mutually coupled flux.

27. The non-transitory computer-readable medium of claim 24, wherein the instructions further cause the at least one processor to:

receive information regarding a first phase in a first distribution line used to supply power between the first wireless power transfer device and a first power supply; and receive information regarding a second phase in a second distribution line used to supply power between the second wireless power transfer device and a second power supply, wherein the one or measurements comprise the first phase and the second phase.

* * * * *